United States Patent [19]
Iravani

[11] Patent Number: 5,936,476
[45] Date of Patent: *Aug. 10, 1999

[54] VCO IN CMOS TECHNOLOGY HAVING AN OPERATING FREQUENCY OF 3 GHZ AND GREATER

[75] Inventor: Kamran Iravani, San Jose, Calif.

[73] Assignee: VLSI Technology, Inc., San Jose, Calif.

[ * ] Notice: This patent is subject to a terminal disclaimer.

[21] Appl. No.: 08/972,374

[22] Filed: Nov. 18, 1997

[51] Int. Cl.$^6$ .......................................... H03B 5/04
[52] U.S. Cl. ..................... 331/57; 331/177 R; 331/185; 331/34; 331/175; 331/183; 327/261
[58] Field of Search .............................. 331/57, 175, 185, 331/177 R, 34, 183; 327/156, 261

[56] References Cited

U.S. PATENT DOCUMENTS

| | | | |
|---|---|---|---|
| 5,477,182 | 12/1995 | Huizer | 327/261 |
| 5,748,048 | 5/1998 | Moyal | 331/34 |

Primary Examiner—Arnold Kinkead
Attorney, Agent, or Firm—Wagner, Murabito & Hao

[57] ABSTRACT

A CMOS super high speed voltage controlled oscillator (VCO) circuit that operates at frequencies of at least 3 GHz. The VCO circuit of the present invention includes a replica circuit, a first VCO cell coupled to the replica circuit, and a second VCO cell coupled to the first VCO cell and the replica circuit. A VCO output for transmitting a VCO output signal is also included. A first current source is coupled to the first VCO cell to transmit a first current from the power supply to the first VCO cell. A second current source is coupled to the second VCO cell to transmit a second current from the power supply to the second VCO cell. The first VCO cell and the second VCO cell each have respective first and second source follower load transistors coupled to the replica circuit. In addition, the first and second VCO cells, the first and second current sources, and the replica circuit are all fabricated using n-channel MOS transistors. Consequently, the VCO circuit of the present invention reliably oscillates at 3 GHz or above and produces a VCO output having a frequency of 3 GHz or above.

17 Claims, 6 Drawing Sheets

VCO IN CMOS TECHNOLOGY HAVING AN OPERATING FREQUENCY OF 3 GHZ AND GREATER

TECHNICAL FIELD

The present invention relates to the field of super high speed (e.g., greater than 1 GHz) voltage controlled oscillators. More particularly, the present invention relates to a high speed CMOS voltage controlled oscillator.

BACKGROUND ART

Voltage controlled oscillators (VCOs) are well known and widely used in the electronics industry Within the digital communications field, VCOs are used in a variety of applications. Such applications include, for example, frequency synthesizers, signal generation, (e.g., serial transmission clock recovery) and the like. VCOs are typically designed to perform within a given set of boundary conditions and to perform to a specified standard. Typical conditions include, for example, performance over operating temperature ranges, sensitivity to vibration, output sensitivity to interference, and the like. Typical performance standards include, for example, output signal frequency stability, output signal programmability, and the like.

Generally, a prior art VCO generates an oscillating output signal having a specified frequency. The signal can have several different wave forms (e.g., square, saw tooth, triangular, etc.). The frequency of the output is tunable and is a function of an input voltage, an external resistance or capacitance, or the like. The type of application in which the VCO is used dictates its operating conditions and performance requirements.

In addition, the type of application also largely determines type of fabrication technology used to manufacture the VCO. A large number of modern digital integrated circuits are fabricated using well known and widely used CMOS technology. Where the VCO is included in a CMOS IC (integrated circuit), the VCO is usually fabricated in CMOS (e.g., using CMOS fabrication process technology).

There is a problem, however, when the application in which the IC is used requires the VCO to perform at very high operating frequencies. For example, where the IC is part of a high speed serial transmission system (e.g., multi-gigabit high speed networking) it is important that the output frequency of the VCO is stable and is a consistent function of the control inputs (e.g., voltage, capacitance, and the like) while the output frequency is 3 GHz and greater.

In a case where a prior art VCO is used in an application for clock recovery in a multi-gigabit serial transmission system, it is important that the output frequency remain stable and the output waveform remain within specified limits, even at the output frequencies of 3 GHz or more. The output frequency is used to reconstruct a serial transmission clock signal, which in turn, is used to sample data on a serial transmission line. Distortion, defects, irregularity, or variation in the VCO output frequency can have a very detrimental effect on the reconstructed clock signal, and hence, could lead to sampling errors, lost data, decreased throughput, or other such problems.

Consequently, for these very high frequency applications it is important that the VCO provide a very stable output signal at the specified frequency (e.g., 3 GHz). However, prior art CMOS VCOs cannot reliably function at such high frequencies. Prior art CMOS VCOs cannot reliably generate output signals having an acceptable waveform, having acceptable stability, at such high frequencies. Accordingly, system designers are forced to use other, less desirable, alternatives (e.g., transferring data on both the rising and falling edges of a lower speed clock signal, using a separate, non-integrated, non-CMOS VCO, etc.) for high speed applications.

Thus, what is required is a CMOS VCO circuit which solves the high speed operation problems of the prior art. What is required is a circuit capable of reliable operation at frequencies of 3 GHz and above. What is further required is a circuit which can produce a stable output signal having a frequency of 3 GHz and greater. Accordingly, the present invention provides a novel solution to the above requirements.

DISCLOSURE OF THE INVENTION

The present invention provides a CMOS VCO circuit which solves the high speed operation problems of the prior art. The VCO circuit of the present invention is capable of reliable operation at frequencies of 3 GHz and above. In addition, the VCO circuit of the present invention generates a stable output signal having a frequency of 3 GHz and greater.

In one embodiment, the present invention comprises a CMOS super high speed voltage controlled oscillator (VCO) circuit. The VCO circuit of the present invention includes a replica circuit, a first VCO cell coupled to the replica circuit, and a second VCO cell coupled to the first VCO cell and the replica circuit. A VCO output for transmitting a VCO output signal is also included. A first current source is coupled to the first VCO cell to transmit a first current from the power supply to the first VCO cell. A second current source is coupled to the second VCO cell to transmit a second current from the power supply to the second VCO cell. The first VCO cell and the second VCO cell each have respective first and second source follower load transistors coupled to the replica circuit. The source follower load transistors function by limiting the voltage swing of the VCO output signal, improving the speed of the VCO circuit. In addition, the first and second VCO cells, the first and second current sources, and the replica circuit are all fabricated using n-channel MOS transistors, further increasing speed. Consequently, the VCO circuit of the present invention reliably oscillates at 3 GHz or above and produces a VCO output having a frequency of 3 GHz or above.

BRIEF DESCRIPTION OF THE DRAWINGS

The accompanying drawings, which are incorporated in and form a part of this specification, illustrate embodiments of the invention and, together with the description, serve to explain the principles of the invention.

BEST MODE FOR CARRYING OUT THE INVENTION

Reference will now be made in detail to the preferred embodiments of the invention, a VCO circuit in CMOS technology having an operating frequency of 3 GHz and greater, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the appended claims. Furthermore, in the following detailed description of the present invention, numerous specific details are set forth in order to provide a thorough understanding of the present invention. However, it will be obvious to one of ordinary skill in the art that the present invention may be practiced without these specific details. In other instances, well known methods, procedures, components, and circuits have not been described in detail as not to unnecessarily obscure aspects of the present invention.

The present invention provides a CMOS VCO circuit which solves the high speed operation problems of the prior art. The VCO circuit of the present invention is capable of reliable operation at frequencies of 3 GHz and above. In addition, the VCO circuit of the present invention generates a stable output signal having a frequency of 3 GHz and greater. The present invention and its benefits are further described below.

Figure 1:
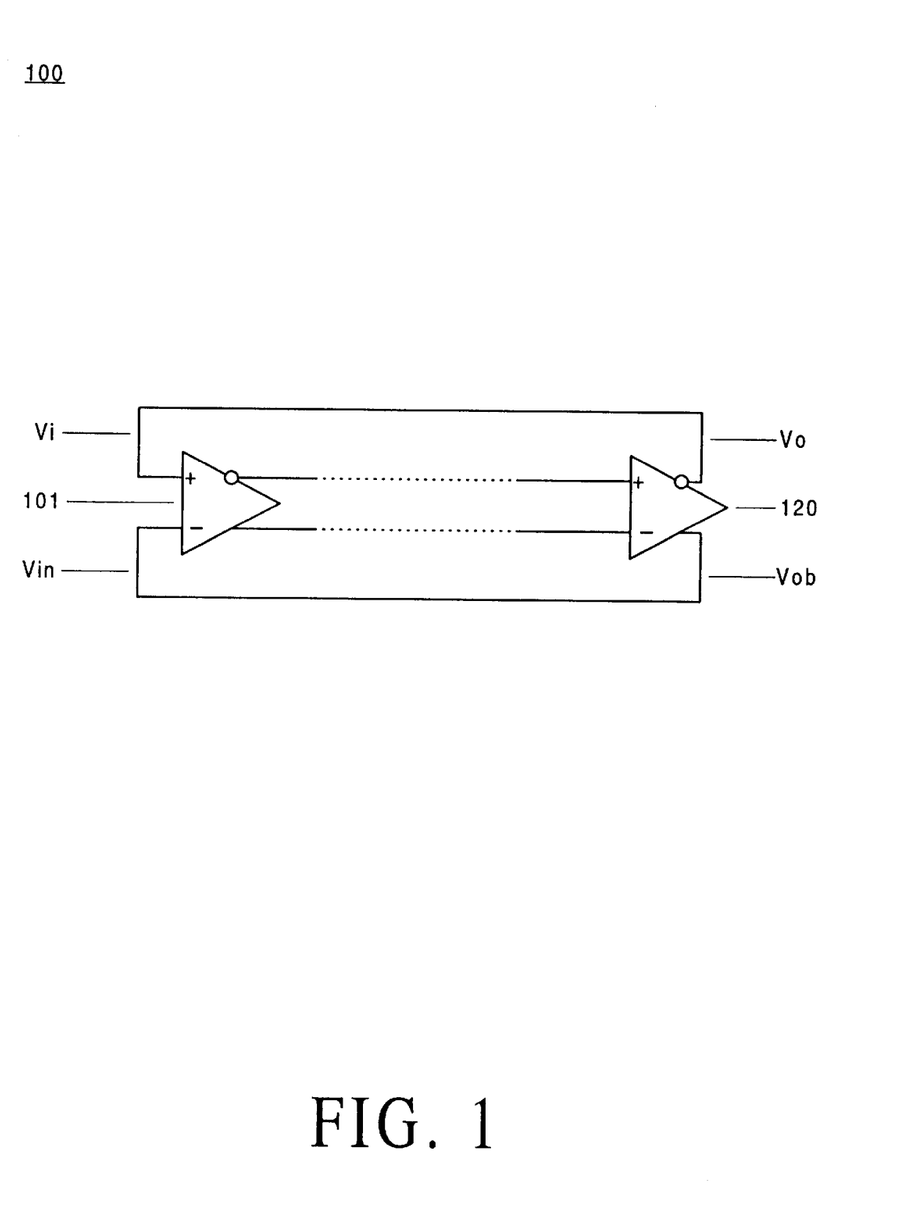
FIG. 1 shows a schematic block diagram of a VCO circuit in accordance with one embodiment of the present invention.

FIG. 1 shows a schematic block diagram of a VCO circuit 100 in accordance with one embodiment of the present invention. VCO circuit 100 illustrates the general scheme of operation of the present invention. VCO circuit 100 is comprised of a plurality of inverters coupled to form a "chain" where the output of the first inverter is coupled to the input of the second inverter, and so on throughout the chain. Each inverter has a positive and a negative input and a corresponding positive and negative output. The first inverter, e.g., inverter 101 of VCO circuit 100 has its outputs coupled to the inputs of the next inverter, and so on, until the last inverter 120 in the chain is coupled. The plurality of inverters between inverter 101 and 120 are represented by dotted lines. The outputs of the last inverter 120 are coupled to the inputs of the first inverter 101.

The resulting feed back effects an oscillation within VCO circuit 100. The number of inverters included in VCO circuit 100 largely determines the resulting natural frequency of oscillation and the total gain. The frequency of oscillation is variable over a range. The degree of variation is determined by the application of a control voltage to the circuitry comprising each inverter. Feedback to the inputs Vi and $Vi_n$ from the outputs Vo and Vob sustain the oscillation. The output signal of VCO circuit 100 is typically taken from the outputs Vo and Vob of the last inverter, inverter 120, although the output signal could be taken from any of the inverters in the chain.

Figure 2:
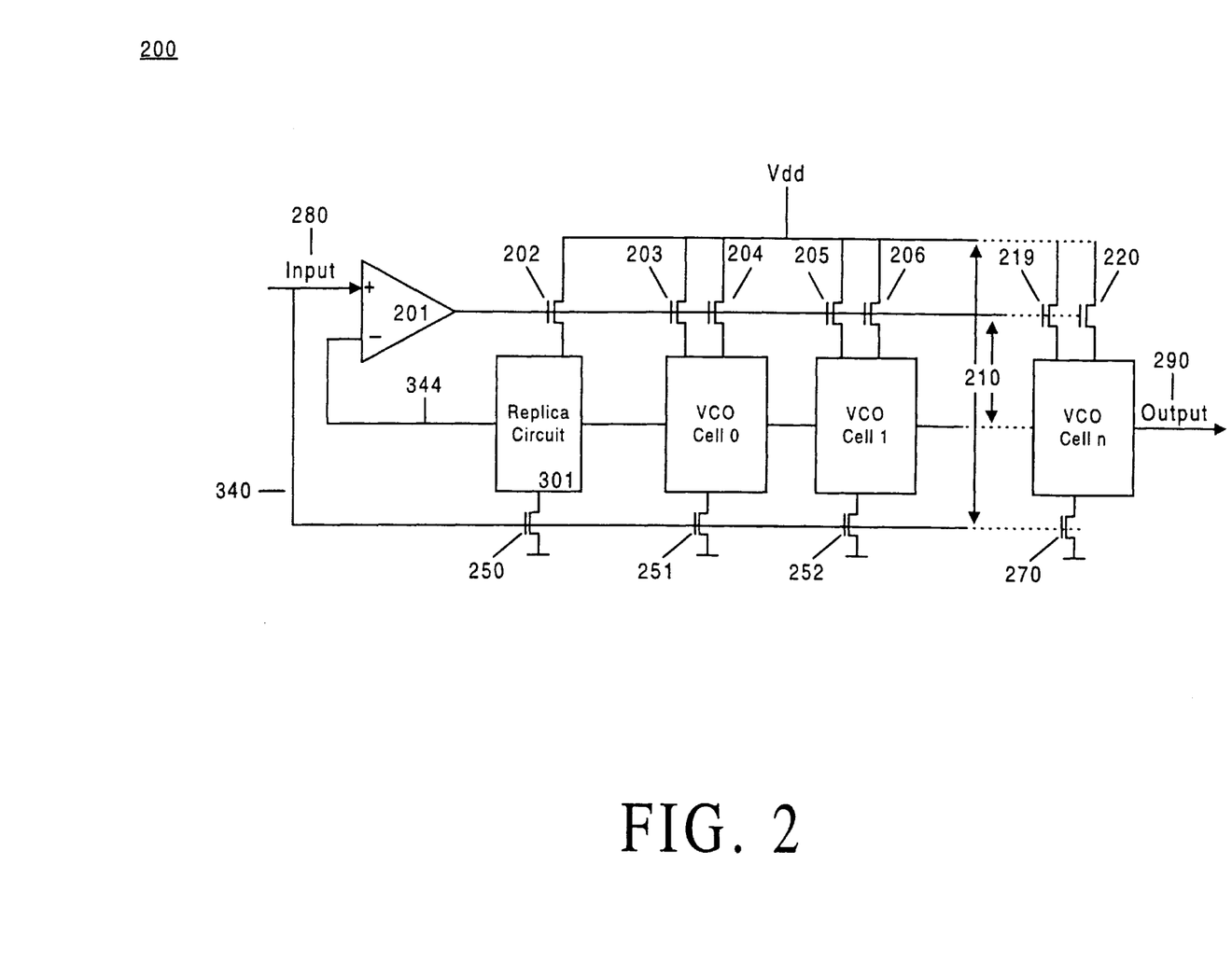
FIG. 2 shows a more detailed block diagram of a VCO circuit in accordance with one embodiment of the present invention.

VCO circuit 100 oscillates and maintains a stable, predictable, output signal at Vo and $Vo_b$ having a frequency which corresponds to an externally applied control voltage (shown in FIG. 2). The frequencies at Vo and $Vo_b$ are substantially the same except for being opposite in phase. The present invention functions by generating a stable output signal having a frequency of 3 GHz and greater.

Referring now to FIG. 2, a more detailed block diagram of a VCO circuit 200 in accordance with present invention is shown. VCO circuit 200 includes a plurality of VCO cells coupled in a chain, in the same manner as inverters 101–120 of VCO circuit 100. The source follower transistors 202–220 function as the loads for the VCO cells. The first VCO cell, VCO cell 0, is coupled to VCO cell 1, and so on, through the last VCO cell in the chain, VCO cell n. The plurality of VCO cells (not shown) between VCO cell 1 and VCO cell n are similarly coupled via dotted lines 210. As with the number of inverters in VCO circuit 100, the number of VCO cells in VCO circuit 200 largely determines the resulting natural frequency of oscillation and the total gain. And, similarly to the outputs of VCO circuit 100, the output of VCO circuit 200 taken from the VCO cell coupled furthest from the control voltage input (e.g., VCO cell n). The designs of each of the VCO cells are optimized to minimize capacitance. This helps facilitate high speed operation. It should be appreciated, however, that the outputs of VCO circuit 200 can be taken from any one of the VCO cells in the chain. Alternatively, several VCO cells, or even all VCO cells, of VCO circuit 200 can be coupled to provide a suitable output, depending upon the particular requirements of an application.

VCO circuit 200, in accordance with the present embodiment, includes an amplifier 201. The output of amplifier 201 is coupled to each of source follower transistors 202, 203, 204, and so on, through to source follow transistor 220 (e.g., where each of VCO cells 0 through n have a respective corresponding source follower transistors). Each of the source follower transistors 202–220 have their respective drains coupled to Vdd (e.g., 3.3 v power supply) and their respective sources coupled to their respective VCO cells, except in the case of source follower transistor 202, where a replica circuit 301 is coupled, as opposed to a VCO cell. Replica circuit 301 is designed to match the current and voltage characteristics a typical VCO cell (e.g., VCO cell 0). Replica circuit 301 is coupled to VCO cell 0 as if it where a typical VCO cell. Replica circuit 301 functions by providing negative feed back to amplifier 201, which in turn controls the voltage at the gates of source follower transistors 202–220. $VCO_{in}$ is the control voltage for VCO circuit 200 and controls the frequency of oscillation.

Replica circuit 301 is designed and fabricated to match the current and voltage characteristics of each of the VCO cells 0 through n. Consequently, negative feed back from replica circuit 301 causes matching corresponding corrections for each VCO cell. For example, as the VCO cells 0 through n oscillate, they draw current from Vdd via source follower transistors 203–220. Each of the source follower transistors 203–220 has a high impedance. Hence, the source follower transistors 203–220 also function by isolating noise on Vdd from the VCO cells. To further increase the impedance, amplifier 201 is coupled to the gates of source follower transistors 203–220. The output of amplifier 201 is controlled in part by the feed back from replica circuit 301. Replica circuit 301 is coupled to source follower transistor 202.

Since replica circuit 301 matches the voltage and current characteristics of the VCO cells (e.g., VCO cell 0), the current flowing through source follower transistor 202 and replica circuit 301 will closely match the currents in the other VCO cells. Thus, by using negative feed back from replica circuit 301, amplifier 201 adjusts the voltage at the gates of source follower transistors 202–220, effectively increasing their impedance. Since replica circuit 301 and each VCO cell is coupled to Vdd, any perturbation (e.g., a voltage spike) in Vdd affects them equally, and hence, the feed back from replica circuit 301 causes an equal correction. This provides much greater isolation from noise, including the particularly problematic low frequency noise, on Vdd.

VCO circuit 200 of FIG. 2 also includes transistors 250–270 coupled respectively to replica circuit 301 and each of the VCO cells 0 through n. Transistors 250–270 function as current sources controlled directly by the input voltage 280 (e.g., the control voltage). The input voltage 280 is coupled directly to the gates of each of transistors 250–270. Hence, the input voltage 280 controls the amount of current flowing through each of the VCO cells, which in turn, controls the frequency of oscillation for VCO circuit 200.

It should be appreciated that all transistors comprising VCO circuit 200 are fast, n-channel MOS transistors. This assists in enabling VCO circuit 200 to function at very high speeds. In addition to high speed, the action of amplifier 201 and the source follower transistors 202–220 provide high power supply noise rejection. Consequently, the output 290 of VCO circuit 200 can reliably have a frequency of 3 GHz or above.

Figure 3:
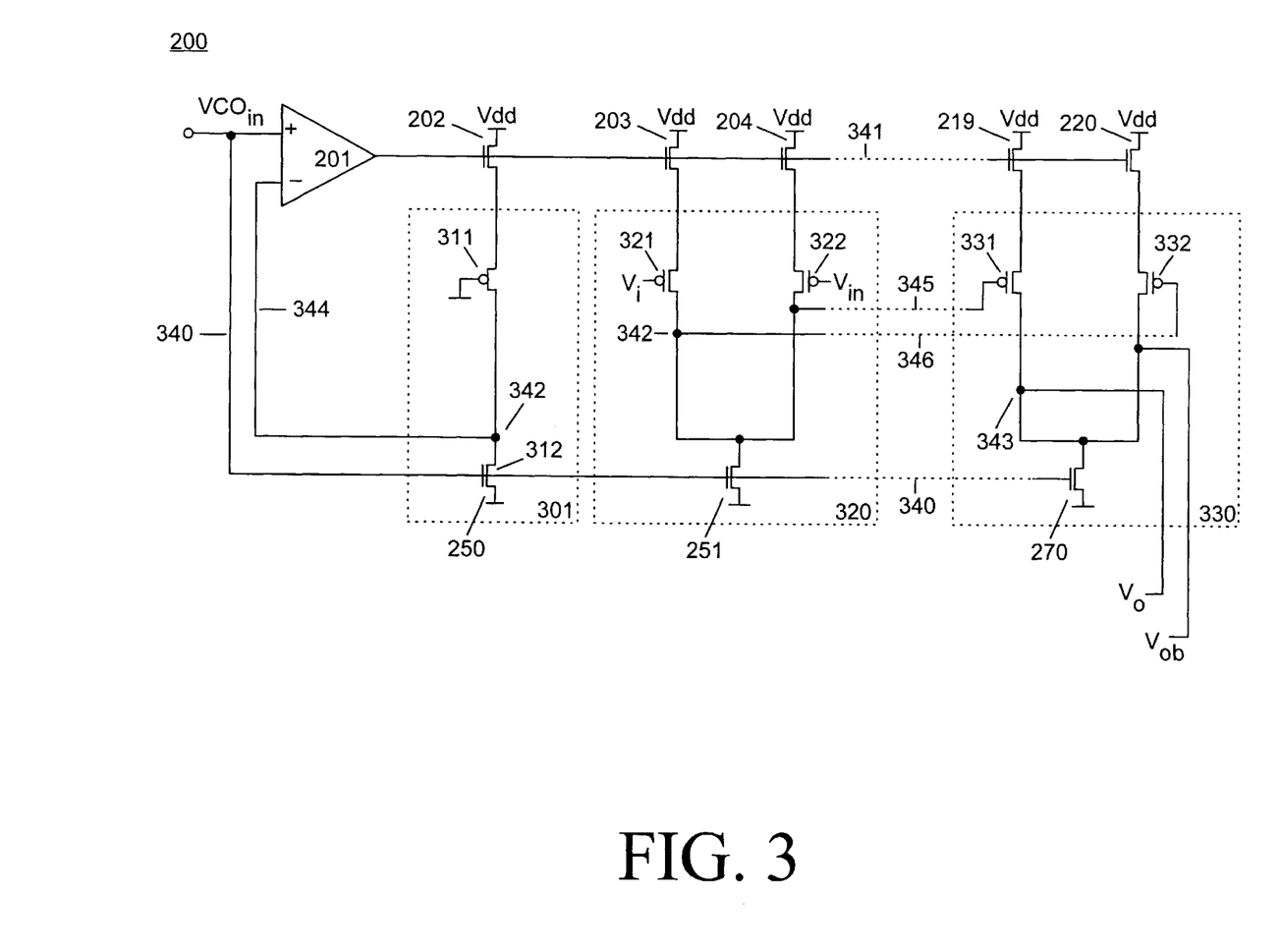
FIG. 3A shows a circuit diagram of the components of the VCO circuit from FIG. 2.
FIG. 3B shows a circuit diagram of the components of a VCO circuit in accordance with an alternate embodiment of the present invention.

Referring now to FIG. 3A, a circuit diagram of VCO circuit 200 of the present invention is shown. Replica circuit 301 corresponds to the replica circuit from FIG. 2, VCO cell 320 corresponds to VCO cell 0, and VCO cell 330 corresponds to VCO cell n. VCO cell 0 includes a transistor 321 and a transistor 322, both coupled to Vdd through source follower transistor 203 and source follower transistor 204. Voltages Vi and $Vi_n$ are respectively coupled to transistors 321–322. Line 340 couples transistors 250–270 to VCOin. VCO cell 330 is similarly constructed, including transistors 331 and 332. VCO cell 330 also includes an output Vo and Vob.

As described above, a plurality of VCO cells (and their corresponding source follower transistors) are coupled between VCO cell 320 and VCO cell 330, along lines 341, 345, 346, and 340. Each of the plurality of VCO cells are coupled to lines 341, 345, 346, and 340 in a manner similar to VCO cell 330, as represented by the dashed portions of lines 341, 345, 346, and 340.

Replica circuit 301 of FIG. 3A includes a transistor 311 and a transistor 250. Transistor 311 is coupled to Vdd via source follower transistor 202. The source of transistor 250 is coupled to ground. Line 341 couples the output of amplifier 201 to the gates of source follower transistors 202–220. Line 344 couples the negative terminal of amplifier 201 to a node 342 between transistor 311 and transistor 250. Node 342 is similar to a node 343 in VCO cell 320 and a node 344 in VCO cell 330.

Referring still to FIG. 3A, in the present embodiment, each VCO cell, for example, VCO cell 320, functions as a differential inverter having n-channel inputs (e.g., Vi and Vin) and n-channel source follower loads (e.g., source follower transistors 203 and 204). By effecting a high impedance at the drain of source follower transistors 203 and 204, changes in Vdd have little effect on the frequency of oscillation. Amplifier 201 controls the voltage at the gate of source follower transistor 203 and 204 to maximize their impedance.

Amplifier 201 controls the voltage at the gate of source follower transistors 203 and 204 through the use of replica circuit 301 and negative feed back on line 344. As described above, the gates of each of source follower transistors 202–220 are coupled to the output of amplifier 201 via line 341. The voltage at node 342 is coupled to the negative terminal of amplifier 201, which consequently adjusts the voltage on line 341, such that a very stable equilibrium is maintained at node 342. In this manner, the action of amplifier 201 "multiplies" the impedance of source follower transistors 202 and 203, and thus, each of source follower transistors 204–220.

Figure 3B:
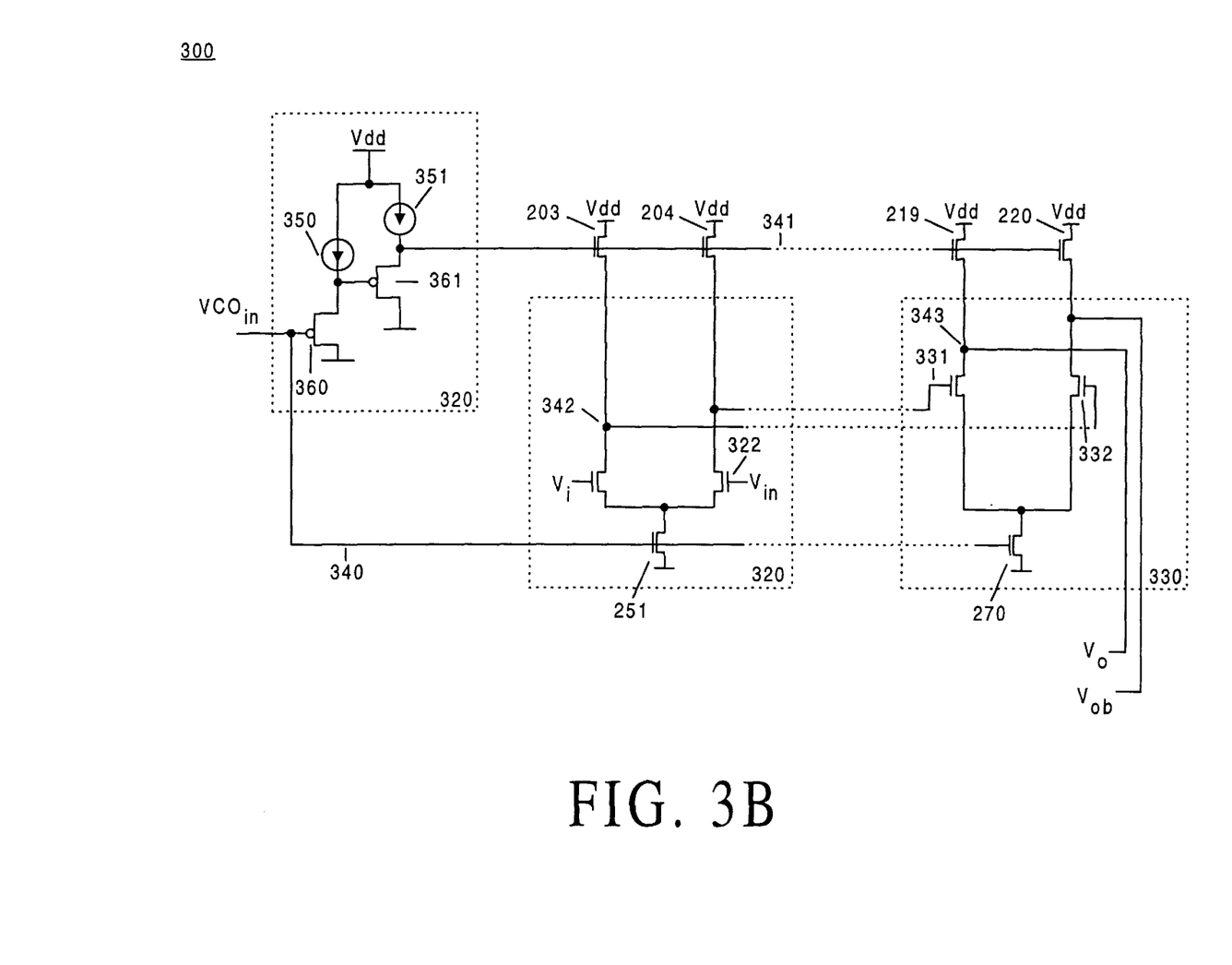

Referring now to FIG. 3B, a VCO circuit 300 in accordance with an alternative embodiment of the present invention is shown. VCO 300 is similar to VCO 200 except that amplifier 201 and replica circuit 301 are replaced by a level shifter 370. Level shifter 370 includes a first reference current 350 and a second reference current 351 respectively coupled to transistors 360 and 361. Level shifter 370 functions in a manner similar to amplifier 201 (e.g., by producing an output coupled to source follower transistors 202–220 via line 341), however, level shifter 370 does not use negative feedback. Through the incorporation of level shifter 370 as opposed to amplifier 201, VCO circuit 300 is more easily implemented in comparison to VCO circuit 200 and is more stable in the presence of high frequency noise on Vdd.

Figure 4:
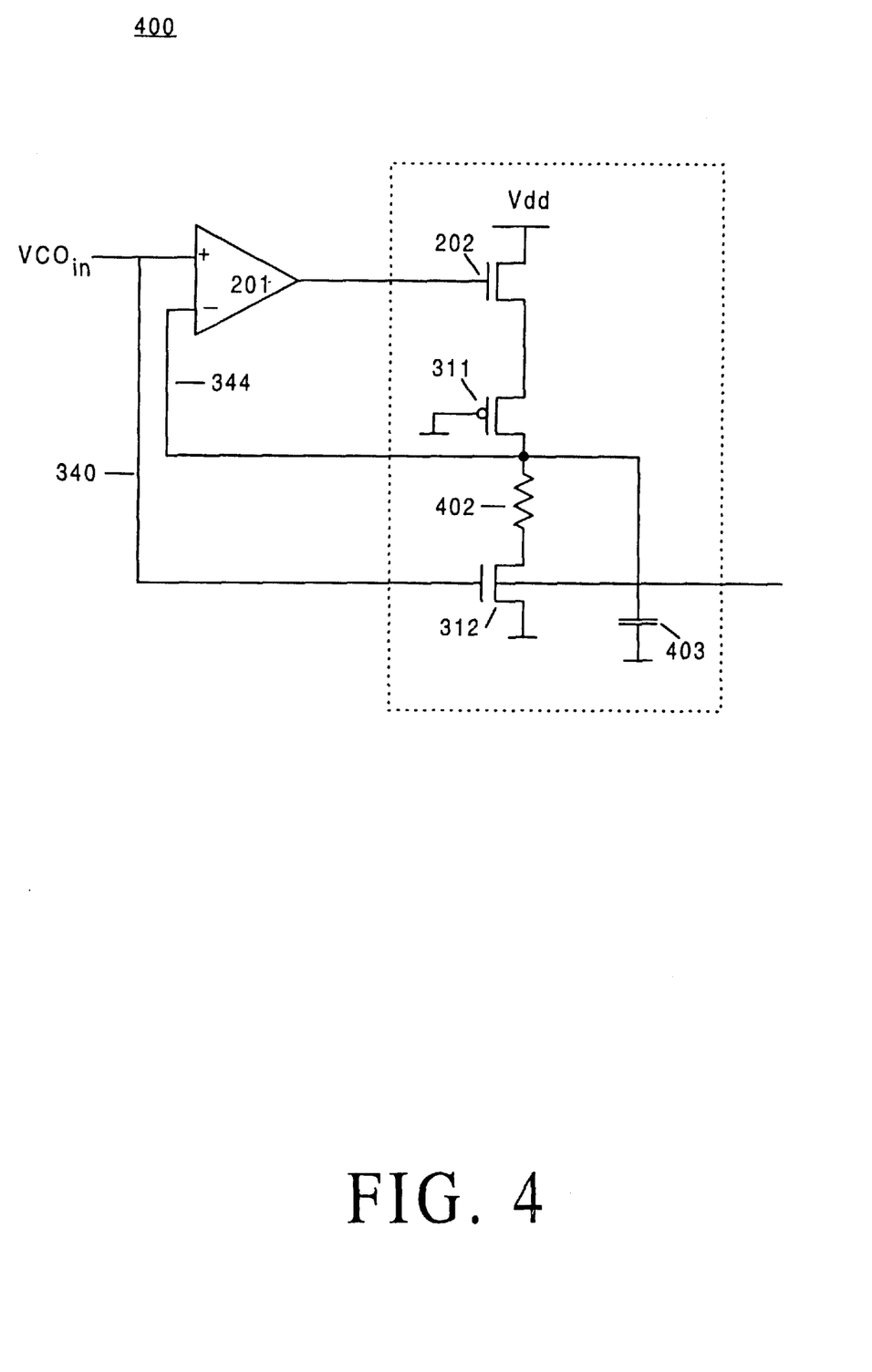
FIG. 4 shows a circuit diagram of a replica circuit in accordance with an alternative embodiment of the present invention.

With reference now to FIG. 4, a replica circuit 400 (shown including source follower transistor 202) in accordance with a first alternate embodiment of the present invention is shown. Replica circuit 400 is coupled to VCO circuit 200 in a manner similar to replica circuit 301, however, replica circuit 400 further includes a resistor 402 and a capacitor 403. VCOin is applied to the positive terminal of amplifier 201. Capacitor 403 combines with resistor 402 to form an RC time constant which improves the frequency response of VCO circuit 200. This RC time constant effects a matching of the frequency response of source follower transistor 202 with the frequency response of amplifier 201. In so doing, replica circuit 400 improves the stability of VCO circuit 200 when operating in the presence of high frequency noise on Vdd. Alternatively, a transistor operating in its linear region can be used as resistor 402.

Figure 5:
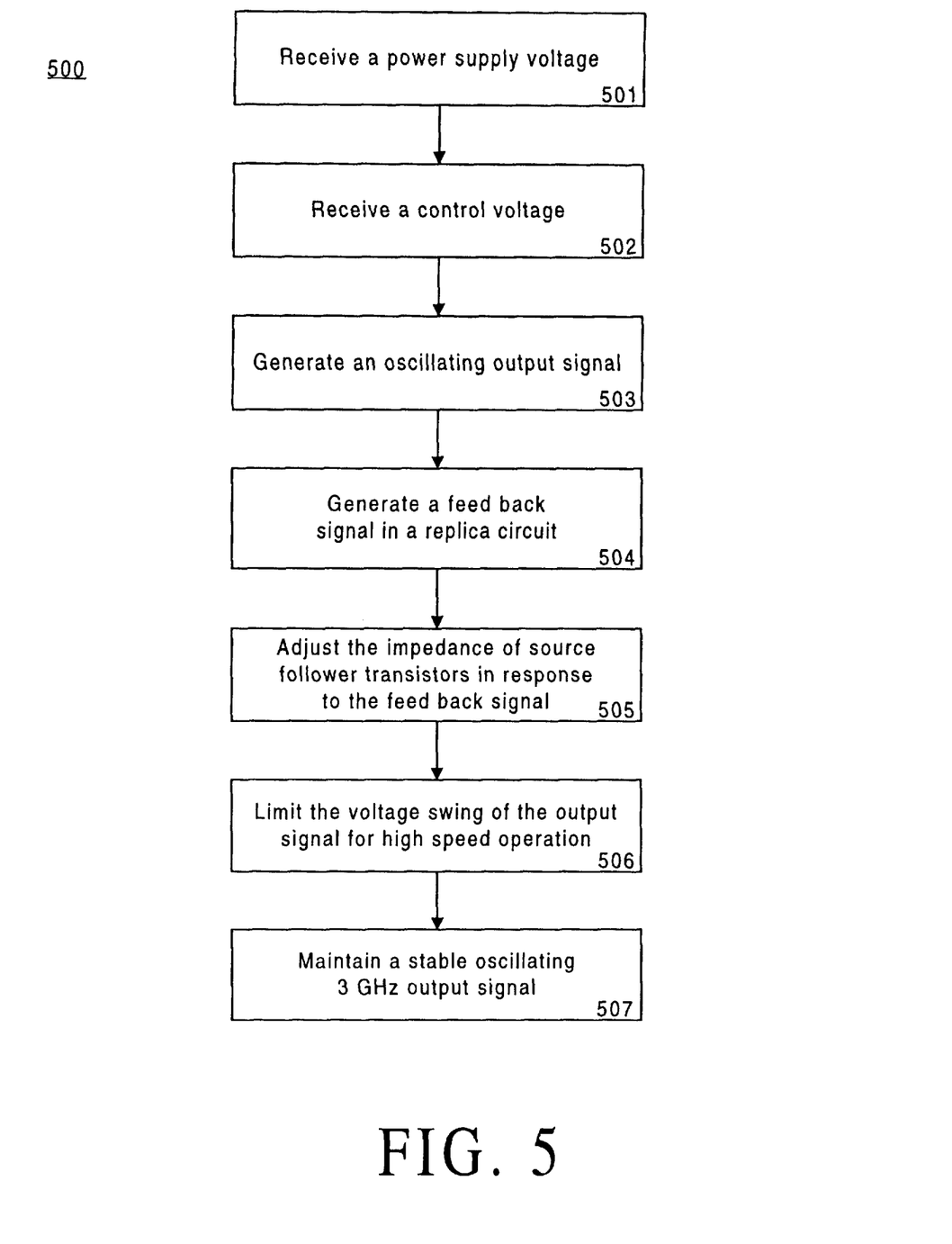
FIG. 5 shows a flow chart of the steps of a process in accordance with one embodiment of the present invention.

FIG. 5 shows a flow chart of the steps of an operating process 500 in accordance with one embodiment of the present invention. Process 500 begins in step 501, where a VCO circuit (e.g., VCO circuit 200 from FIG. 3A) receives a power supply voltage Vdd. VCO circuit 200 is coupled to Vdd via a plurality of included source follower transistors (e.g., source follower transistors 203–220). The current from Vdd sets up an internal oscillation.

In step 502, VCO circuit 200 receives a control voltage input (e.g., $VCO_{in}$) from an external circuit. The control voltage input sets the frequency of oscillation within VCO circuit 200. The frequency of oscillation is variable in response to changes in the control voltage.

In step 503, the oscillation described above is used to generate an oscillating output signal. As described above, in the present embodiment, the output signal is taken from one of the VCO cells in the VCO circuit (e.g., VCO cell 330). A first output, Vo, and a second output, $Vo_b$, are coupled to VCO cell 330 such that $VO_b$ is an inverted version of Vo (e.g., phase reversed).

In step 504 of FIG. 5, VCO circuit 200, in accordance with the present invention, generates a feed back signal in a replica circuit (e.g., replica circuit 301). As described above, replica circuit 301 is designed to match the current and voltage characteristics of the other VCO cells (e.g., VCO cell 320) within VCO circuit 200.

In step 505, the feed back provided by replica circuit 301 is used to adjust the voltage at the gates of each of source follower transistors 202–220, thereby increasing their impedance, and thus, the insensitivity of VCO circuit 200 to Vdd noise. The feed back signal is coupled to the negative terminal of an amplifier (e.g., amplifier 201). The output of the amplifier is coupled to the gates of each of the source follower transistors 202–220.

In step 506, the source follower transistors function by limiting the voltage swing of the output signal of VCO circuit 200. Since source follower transistors 202–220 are n-channel MOS transistors (as with all the transistors comprising VCO circuit 200) and since source follower transistors limit the voltage swing of the output signal, VCO circuit 200 is able to oscillate at frequencies of 3 GHz and above.

Hence, in step 507, VCO circuit 200, in accordance with the present invention, maintains a stable oscillating 3 GHz output signal, resistant to noise on Vdd. The 3 GHz output signal retains its stability due to the fact that VCO circuit 200, as described above, rejects noise on Vdd.

Thus, the CMOS VCO circuit of the present invention solves the high speed operation problems of the prior art. The VCO circuit of the present invention is capable of reliable operation at frequencies of 3 GHz and above. In addition, the VCO circuit of the present invention generates a stable output signal having a frequency of 3 GHz and greater.

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the claims appended hereto and their equivalents.

What is claimed is:

1. A voltage controlled oscillator (VCO) circuit, comprising:
   a replica circuit for providing feedback;
   a first VCO cell coupled to said replica circuit;
   a second VCO cell coupled to said first VCO cell and said replica circuit;
   a VCO output for transmitting a VCO output signal;
   a first current source coupled to said first VCO cell to supply a first current from a power supply to said first VCO cell;
   a second current source coupled to said second VCO cell to supply a second current from said power supply to said second VCO cell;
   said first VCO cell and said second VCO cell include respective first and second source follower load transistors coupled to said replica circuit, wherein said replica circuit adjusts said feedback to compensate for noise on said power supply, said first and second VCO cells, said first and second current sources, and said replica circuit fabricated using n-channel MOS transistors, such that said voltage controlled oscillator circuit reliably oscillates at 3 GHz or above; and
   an amplifier having a positive input terminal, a negative input terminal and an output terminal, said positive input terminal coupled to receive a control voltage input, said negative input terminal coupled to receive a feedback signal from said replica circuit, and said output terminal coupled to control said respective first and second source follower load transistors whereby the replica circuit is configured to match the frequency response of the amplifier to the frequency response of the first source follower load transistor.

2. The voltage controlled oscillator circuit of claim 1, further comprising:
   first and second voltage inputs included in each of said first VCO cell and said second VCO cell;
   first and second voltage outputs included in each of said first VCO cell and said second VCO cell;
   said first and second voltage outputs of said first VCO cell respectively coupled to said first and second voltage inputs of said second VCO cell and said first and second voltage outputs of said second VCO cell respectively coupled to said first and second voltage inputs of said first VCO cell to sustain an oscillation within said VCO circuit.

3. The voltage controlled oscillator circuit of claim 1, further including a level shifter coupled to receive a control voltage input and control said respective first and second source follower load transistors in response.

4. The voltage controlled oscillator circuit of claim 1, wherein said replica circuit is frequency response optimized to improve the frequency response of said VCO circuit.

5. The voltage controlled oscillator circuit of claim 1, wherein said respective first and second source follower load transistors are coupled to directly receive said control voltage input.

6. The voltage controlled oscillator circuit of claim 1, wherein said respective first and second source follower load transistors limit the amplitude swing of said VCO output signal.

7. The voltage controlled oscillator circuit of claim 1, wherein said VCO output is coupled to receive said VCO output signal from said second VCO cell.

8. The voltage controlled oscillator circuit of claim 1, wherein said replica circuit is adapted to provide a negative feedback signal to an amplifier to improve power supply noise rejection of said VCO circuit.

9. The voltage controlled oscillator circuit of claim 1, wherein said VCO circuit is fabricated with n-channel MOS transistors for higher speed.

10. A CMOS voltage controlled oscillator (VCO) circuit for generating a VCO output signal having a frequency of 3 GHz and greater, comprising:
    an amplifier for receiving a VCO input;
    a replica circuit coupled to said amplifier to provide feed back;
    a first VCO cell coupled to said replica circuit;
    a second VCO cell coupled to said first VCO cell and said replica circuit, wherein said replica circuit adjusts said feedback to compensate for noise on a power supply;
    a VCO output for transmitting a VCO output signal;
    a first current source coupled to said first VCO cell to supply a first current from said power supply to said first VCO cell;
    a second current source coupled to said second VCO cell to supply a second current from said power supply to said second VCO cell;
    said first VCO cell and said second VCO cell having respective first and second source follower load transistors coupled to said amplifier, said respective first and second source follower load transistors adapted to limit the amplitude swing of said VCO output signal, and said VCO circuit fabricated with n-channel MOS transistors, such that said VCO output signal has a frequency of at least 3 Ghz; and said amplifier further including a positive input terminal, a negative input terminal, and an output terminal, said positive input terminal coupled to receive a control voltage input, said negative input terminal coupled to receive said feed back signal from said replica circuit, and said output terminal coupled to control said respective first and second source follower load transistors whereby the replica circuit is configured to match the frequency response of the amplifier to the frequency response of the first source follower load transistor.

11. The voltage controlled oscillator circuit of claim 10, further comprising:

first and second voltage inputs included in each of said first VCO cell and said second VCO cell;

first and second voltage outputs included in each of said first VCO cell and said second VCO cell;

said first and second voltage outputs of said first VCO cell respectively coupled to said first and second voltage inputs of said second VCO cell and said first and second voltage outputs of said second VCO cell respectively coupled to said first and second voltage inputs of said first VCO cell to sustain an oscillation within said VCO circuit.

12. The voltage controlled oscillator circuit of claim 10, wherein said first VCO cell and said second VCO cell are optimized for reduced capacitance for higher oscillation frequencies.

13. The voltage controlled oscillator circuit of claim 10, wherein said replica circuit is frequency response optimized to improve the frequency response of said VCO circuit.

14. The voltage controlled oscillator circuit of claim 10, wherein said respective first and second source follower load transistors are coupled to directly receive said control voltage input.

15. The voltage controlled oscillator circuit of claim 10, wherein said respective first and second source follower load transistors limit amplitude swing of said VCO output signal.

16. The voltage controlled oscillator circuit of claim 10, wherein said VCO output is coupled to receive said VCO output signal from said second VCO cell.

17. The voltage controlled oscillator circuit of claim 10, wherein said replica circuit is adapted to provide said negative feedback signal to said amplifier to improve power supply noise rejection of said VCO circuit.

* * * * *